US010711979B2

(12) United States Patent
Chen et al.

(10) Patent No.: US 10,711,979 B2
(45) Date of Patent: Jul. 14, 2020

(54) OPTICAL MODULE

(71) Applicants: Hisense Broadband Multimedia Technologies Co., Ltd., Qingdao, Shandong (CN); Hisense Broadband Multimedia Technologies, Ltd., Tortola (VG)

(72) Inventors: Jinlei Chen, Shandong (CN); Yinlong Liu, Shangdong (CN); Baofeng Si, Shandong (CN)

(73) Assignees: HISENSE BROADBAND MULTIMEDIA TECHNOLOGIES CO., LTD., Qingdao (CN); HISENSE BROADBAND MULTIMEDIA TECHNOLOGIES, LTD., Tortola (VG)

( * ) Notice: Subject to any disclaimer, the term of this patent is extended or adjusted under 35 U.S.C. 154(b) by 180 days.

(21) Appl. No.: 15/912,276

(22) Filed: Mar. 5, 2018

(65) Prior Publication Data
US 2018/0283658 A1 Oct. 4, 2018

(30) Foreign Application Priority Data

Mar. 29, 2017 (CN) .......................... 2017 1 0197233
Mar. 29, 2017 (CN) .......................... 2017 1 0199126

(51) Int. Cl.
F21V 15/01 (2006.01)
H04B 10/40 (2013.01)
(Continued)

(52) U.S. Cl.
CPC .......... F21V 15/012 (2013.01); F21V 23/002 (2013.01); G02B 6/4277 (2013.01);
(Continued)

(58) Field of Classification Search
CPC .......................... F21V 15/012; G02B 6/4277
See application file for complete search history.

(56) References Cited

U.S. PATENT DOCUMENTS 6,116,788 A 9/2000 Melchior et al.
7,416,433 B1* 8/2008 Wu ...................... G02B 6/4246
439/160
2007/0183128 A1 8/2007 Pirillis et al.

FOREIGN PATENT DOCUMENTS

CN 105723266 A 6/1916
CN 103869426 A 6/2014
CN 206274709 6/2017

OTHER PUBLICATIONS

State Intellectual Property Office of the People's Republic of China, Office Action and Search Report Issued in Application No. 201710199126.X, dated Jun. 3, 2019, 9 pages,(Submitted with Machine Translation).
(Continued)

Primary Examiner — Omar R Rojas
(74) Attorney, Agent, or Firm — Brinks Gilson & Lione

(57) ABSTRACT

An optical module comprising an upper portion of the housing with a bottom and two sides, a lower portion of the housing with a bottom and two sides, an electric component and an electroconductive sheet is provided. The two sides of the upper portion may be inserted between the two sides of the lower portion to form a relatively closed cavity for accommodating the electric component. A first convex block provided on the sides of the upper portion may be inserted into a gap which is formed between a second convex block and a third convex block provided on the sides of the lower portion. Thus, the first convex block, the second convex block and the third convex block may clamp the electro-
(Continued)

conductive sheet, thereby dividing the gap at the junction of the upper portion and the lower portion into a plurality of tiny gaps.

19 Claims, 6 Drawing Sheets

(51) Int. Cl.
*F21V 23/00* (2015.01)
*G02B 6/42* (2006.01)
*H05K 9/00* (2006.01)

(52) U.S. Cl.
CPC ........... *H04B 10/40* (2013.01); *H05K 9/0049* (2013.01); *H05K 9/0058* (2013.01)

(56) References Cited

OTHER PUBLICATIONS

A first Action to Chinese Application No. 201710197233.9, dated Mar. 26, 2018, and concise explanation English translation, (6p).

* cited by examiner

OPTICAL MODULE

CROSS REFERENCE TO RELATED APPLICATIONS

This application claims priority to Chinese Patent Applications No. 201710197233.9, entitled "Optical Module" and filed on Mar. 29, 2017, and Chinese Patent Application No. 201710199126.X, entitled "Optical Module" and filed on Mar. 29, 2017, both of which are hereby incorporated by reference in their entireties.

TECHNICAL FIELD

The present disclosure relates to the field of optical communications, and more particularly, to an optical module.

BACKGROUND

An optical transceiver module, which is also referred to as an optical module, is an important device for realizing optic-electric conversion or electro-optic conversion in an optical communication system. As a signal transmitter of a fiber-optic communication system, an optical module may convert a received electrical signal into an optical signal, and the conversion may be achieved by driving a laser to emit light with a laser-driving circuit. After being transmitted through a fiber optic medium, the optical signal may be reverted into the electrical signal by another optical module as a corresponding signal receiver, and the conversion may be achieved by an optical detector and a limiting amplifier.

An electromagnetic field produced by such electric components as a laser driving circuit, a laser and an optical detector in the optical module when performing the optic-electric conversion and the electro-optic conversion may bring interference to external. For example, the electromagnetic signal may pose electromagnetic interferences to other devices such as a relay in a fiber optic communication system to different extents, thereby affecting signal transmitting or processing rates and accuracy of the other devices. Moreover, these electric components may be susceptible to the interference of an electromagnetic field outside the optical module. For example, electromagnetic signals generated by other devices in the fiber optic communication system will also inevitably affect the optic-electric/electro-optic conversion performance of the optical module. Therefore, these electric components are enclosed in a housing of the optical module to achieve electromagnetic isolation so that the optical module can work normally in an electromagnetic environment and will not produce electromagnetic interferences unbearable by other devices in the environment.

To achieve the electromagnetic isolation, a housing of the optical module may be made of a metal material. Moreover, to facilitate production and assembly, the housing of the optical module may be divided into an upper portion of the housing and a lower portion of the housing, and the upper portion of the housing and the lower portion of the housing may be fitted together to form a cavity for enclosing electric components, thereby shielding the electromagnetic field.

SUMMARY

An example of the present disclosure provides an optical module, of which a housing is made of a metal material to improve electromagnetic shielding effect.

To achieve the above effect, the following technical solutions are employed in an example of the present disclosure.

According to an example of the present disclosure, an optical module includes a housing comprising a lower portion of the housing and an upper portion of the housing. The upper portion of the housing includes a bottom and two sides defining a U-shape. The lower portion of the housing includes a bottom and two sides defining a U-shape. The two sides of the upper portion of the housing are inserted between the two sides of the lower portion of the housing to form a cavity. At least one first convex block is disposed on an outer surface of each of the two sides of the upper portion of the housing, and is configured to face one of the two sides of the lower portion of the housing. At least one second convex block and at least one third convex block are disposed on an inner surface of each of the two sides of the lower portion of the housing, and are configured to face one of the two sides of the upper portion of the housing. The at least one first convex block is inserted into a gap between the at least one second convex block and the at least one third convex block. An electro-conductive sheet is disposed between the at least one first convex block, the at least one second convex block and the at least one third convex block. At least one electric component is disposed inside the cavity.

According to an example of the present disclosure, an optical module includes a housing comprising a lower portion of the housing and an upper portion of the housing. The upper portion of the housing includes a bottom and two sides defining a U-shape, wherein a first metal vertical rib is disposed on an outer surface of the two sides of the upper portion of the housing. The lower portion of the housing includes a bottom and two sides defining a U-shape. A second metal vertical rib is disposed on an inner surface of the two sides of the lower portion of the housing. The two sides of the upper portion of the housing are inserted between the two sides of the lower portion of the housing to form a cavity. The first metal vertical rib and the second metal vertical rib are distributed in a staggered manner. A size that the first metal vertical rib and the second metal vertical rib protrude toward the corresponding housing is smaller than a distance between two facing sides of the upper portion of the housing and the lower portion of the housing. Elastic electric conductors are disposed tightly between the first metal vertical rib and a facing side of the lower portion of the housing and between the second metal vertical rib and a facing side of the upper portion of the housing. A circuit board is disposed inside the cavity.

BRIEF DESCRIPTION OF DRAWINGS

To illustrate more clearly the technical solutions in examples of the present disclosure, the accompanying drawings required in descriptions of the examples or the prior art will be briefly described below. Apparently, the drawings in the following descriptions are merely some examples of the present disclosure, and other drawings may also be obtained by those of ordinary skill in the art according to these drawings without paying any creative work.

DETAILED DESCRIPTION

The technical solutions of examples of the present disclosure will be described clearly and fully below in combination with drawings in the examples of the present disclosure. It is apparent that the described examples are merely part of examples of the present disclosure rather than all examples. Other examples achieved by those of ordinary skill in the art based on the examples in the present disclosure without paying creative work shall all fall into the scope of protection of the present disclosure.

Figure 1A:
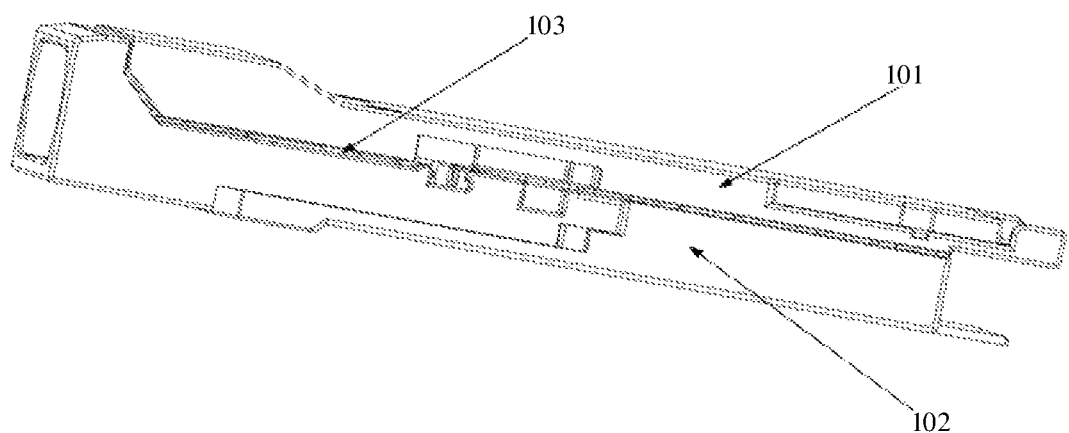
FIG. 1A is a schematic diagram illustrating a structure of an optical module according to an example of the present disclosure.

In a manufacturing process of an optical module, it is desired to accommodate components such as a circuit board, a Microprocessor Control Unit (MCU) and a laser in a housing. Further, it may be necessary to perform fixation and heat dissipation design for the above components. For example, FIG. 1A is a schematic diagram illustrating a structure of an optical module according to an example of the present disclosure. As shown in FIG. 1A, the optical module may include an upper portion of the housing 101 and a lower portion of the housing 102. The upper portion of the housing 101 and the lower portion of the housing 102 may form a relatively closed cavity space in which such electric components as a circuit board may be disposed. With shielding of the housings 101, 102, anti-electromagnetic interference capability of the optical module will be improved to some extent.

To achieve electromagnetic isolation, the housings 101, 102 of the optical module may be made of a metal material. Since the housings 101, 102 made of a metal material may be stiff, the upper portion of the housing 101 and the lower portion of the housing 102 may not be completely fitted due to a dimensional processing error when the housings 101, 102 are to be fitted, thus, forming a long and narrow gap 103 at the junction of the upper portion of the housing 101 and the lower portion of the housing 102. It is apparent that the gap 103 will affect the shielding effect of the housings 101, 102 against electromagnetic field.

Figure 1B:
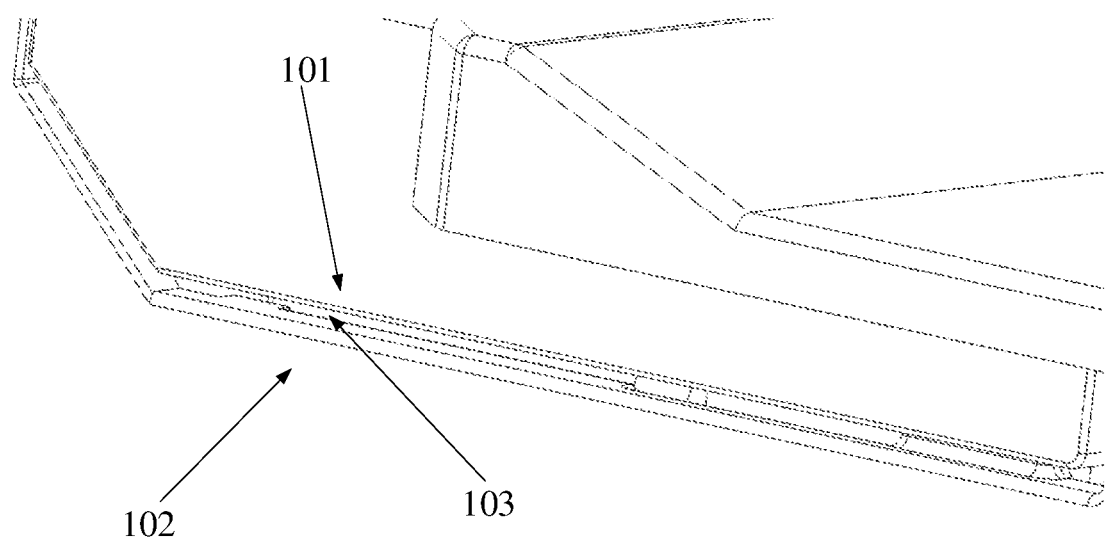
FIG. 1B is a schematic diagram illustrating a partial structure of an optical module according to an example of the present disclosure.

FIG. 1B is a schematic diagram illustrating a partial structure of an optical module according to an example of the present disclosure. As shown in FIG. 1B, the gap 103 is formed between two side surfaces at the junction of the upper portion of the housing 101 and the lower portion of the housing 102. The lower portion of the housing 102 may include a bottom and two sides perpendicular to the bottom. Each of the sides has a particular thickness and the gap 103 is formed in the thickness direction of the side. The formation of the gap 103 may result from that the side surfaces of the upper portion of the housing 101 and the lower portion of the housing 102 cannot be perfectly aligned and fitted.

Figure 2:
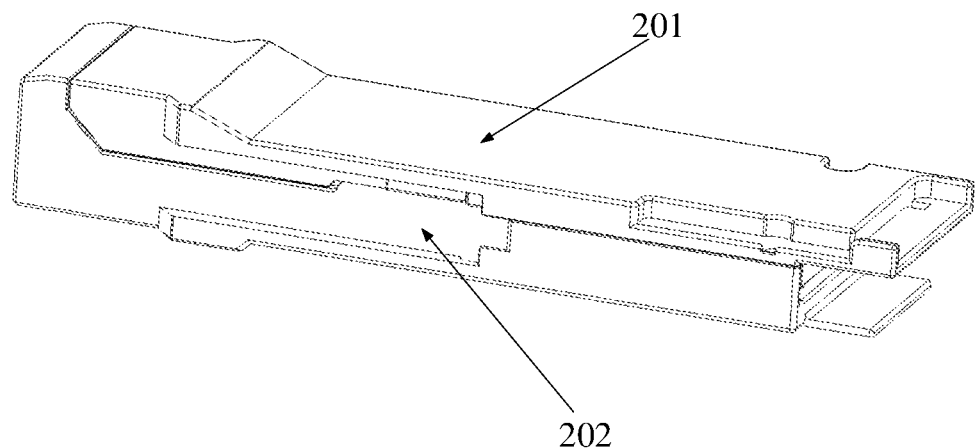
FIG. 2 is a schematic diagram illustrating an external structure of an optical module according to an example of the present disclosure.

FIG. 2 is a schematic diagram illustrating an external structure of an optical module according to an example of the present disclosure. As shown in FIG. 2, an optical module according to an example of the present disclosure may include an upper portion of the housing 201 and a lower portion of the housing 202. A cuboid-shaped cavity having two open ends may be formed by fitting the upper portion of the housing 201 onto the lower portion of the housing 202. The two open ends may serve as an optical port and an electrical port of the optical module, respectively, where fiber-optics may be inserted into a fiber optic adapter in the optical module through the optical port. Since both the fiber-optics and the fiber optic adapter may be passive components, no electromagnetic field may be generated at the optical port of the optical module in normal circumstances, and therefore, electromagnetic isolation for the optical port may not need to take into account. The electrical port may be provided with a golden finger. The golden finger may be inserted into a cage of an external system. Due to an electromagnetic isolation design in the cage of the external system, electromagnetic isolation for the electrical port may also not need to take into account.

Figure 3:
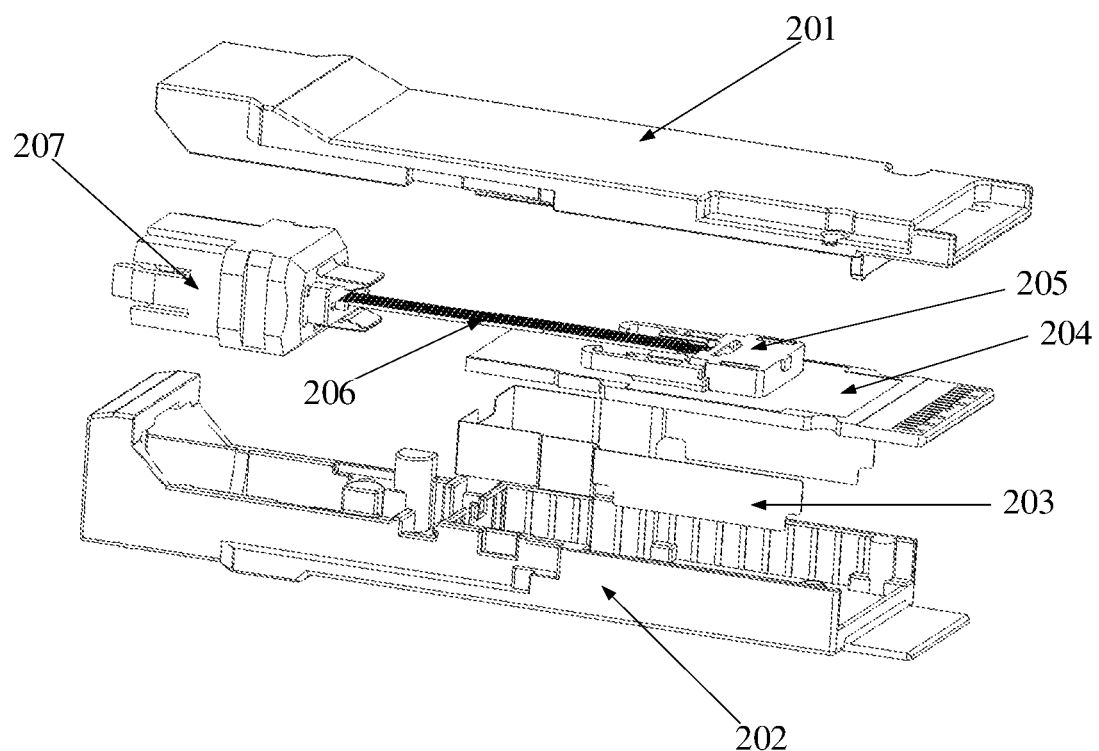
FIG. 3 is an exploded diagram illustrating a structure of the optical module of FIG. 2.

FIG. 3 is an exploded diagram illustrating a structure of the optical module of FIG. 2. As shown in FIG. 3, the optical module may include an upper portion of the housing 201, a circuit board 204, a lens assembly 205, a laser, an optical detector, an electro-conductive sheet 203, a fiber ribbon 206, a fiber jack 207 and a lower portion of the housing 202, where the lens assembly 205 is placed on the circuit board 204. The laser and the optical detector are positioned in a cavity formed by the lens assembly 205 and the circuit board 204. There may be other circuits cooperating with the laser and the optical detector on the circuit board 204, and these electric components may produce an electromagnetic field when being powered on. Further, a high-rate optical module may produce a stronger electromagnetic field.

A housing of an optical module may be divided into the upper portion of the housing 201 and the lower portion of the housing 202. When the upper portion of the housing 201 is fitted onto the lower portion of the housing 202, a relatively closed cavity may be formed to accommodate the above electric components so that the electromagnetic field generated by powering on the electric components can be shielded. At the same time, the housings 201, 202 may also prevent an electromagnetic field outside the optical module from affecting the operation of the electric components inside the optical module. The upper portion of the housing 201 and the lower portion of the housing 202 may be fitted together to form an effective electromagnetic shielding cavity. The upper portion of the housing 201 and the lower portion of the housing 202 plays a main role in electromagnetic shielding, and therefore, a conductor having a relatively high electrical conductivity and a relatively high magnetic conductivity, for example, metal materials such as silver, copper, aluminum and alloys thereof, may be chosen as the material of the upper portion of the housing 201 and the lower portion of the housing 202. A material of high electrical conductivity can generate a large reverse induced current under the action of electromagnetic wave and consume more electromagnetic wave energy, thus achieving a better electromagnetic shielding effect.

In addition, the upper portion of the housing 201 and the lower portion of the housing 202 may have an environmental isolation effect in addition to the electromagnetic isolation effect on the circuit board 204. Many optical modules may be applied in quite harsh environments. For example, some optical modules used in base stations for communication are exposed to high temperature and high humidity environments for a long time, and the housing structures of the optical modules may be easily corroded and damaged by chemical substances in the atmosphere, thereby affecting the working condition of main bodies therein. In this example, the upper portion of the housing 201 and the lower portion of the housing 202 may be made of one of a tin alloy, a nickel alloy and a tin-nickel alloy. Where, the tin alloy is formed by the tin element and other metal elements such as lead, zinc and copper with the tin element as basic element. The tin alloy has high thermal conductivity and high resistance to atmospheric corrosion. The nickel alloy is formed by the nickel element and other elements such as chromium, aluminum and zirconium with the nickel as basic element. The nickel alloy has excellent oxidation resistance, corrosion resistance and high temperature strength. The tin-nickel alloy has the combination of properties of the above tin alloy and nickel alloy, providing better protection for the main body accommodated in the upper portion of the housing 201 and the lower portion of the housing 202.

Figure 4:
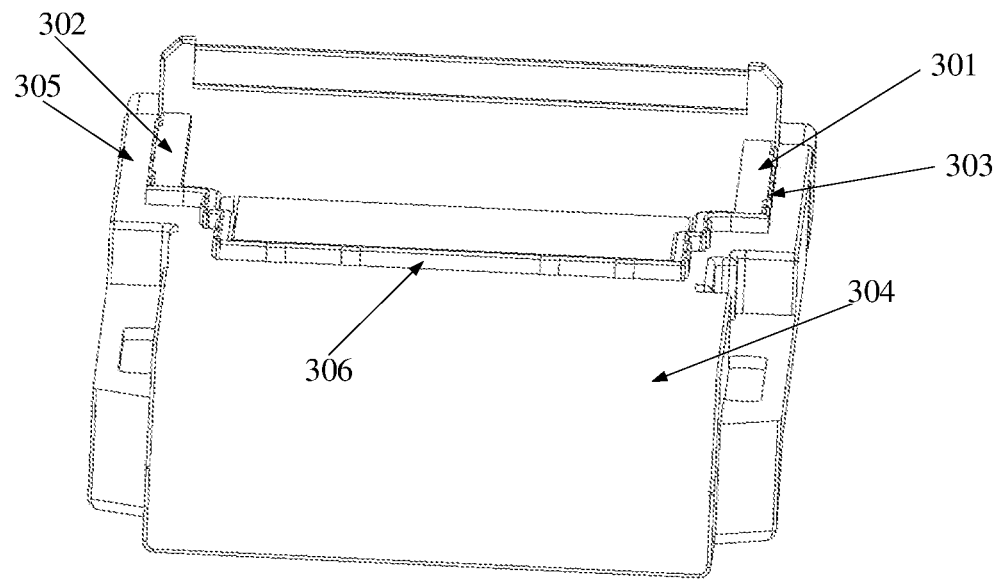
FIG. 4 is a schematic diagram illustrating a structure of an upper portion of the housing of an optical module according to an example of the present disclosure.

FIG. 4 is a schematic diagram illustrating a structure of the upper portion of the housing of the optical module of FIG. 2. As shown in FIG. 4, a bottom 304 and two sides 301, 302 of the upper portion of the housing define a U-shape, where the bottom 304 is formed as the bottom of the U-shape, and the two sides 301, 302 perpendicular to the bottom are formed as the two sides of the U-shape. The sides 301, 302 are distributed in the width direction of the bottom 304 and may be parallel to each other. The sides 301, 302 are perpendicular to the bottom 304 at a position having a particular distance away from the edge of the bottom 304 rather than at the edge of the bottom 304, such that the bottom 304 has a protruding section 305 relative to the sides 301, 302. The protruding section 305 is configured to be fitted on a side of the lower portion of the housing.

There may be a plurality of first convex blocks 303 spaced from each other on the surfaces of the sides 301, 302, and there may be a gap between every two adjacent first convex blocks 303.

Alternatively, the upper portion of the housing may also include an upper partition 306 perpendicular to all of the bottom 304 and the two sides 301, 302. A fourth convex block may be provided on the surface of the upper partition 306.

Figure 5:
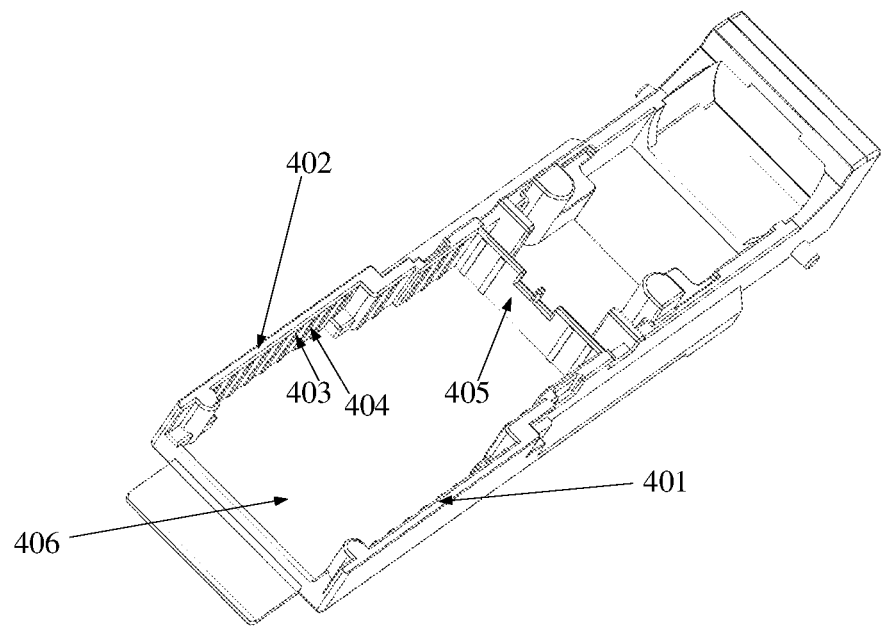
FIG. 5 is a schematic diagram illustrating a structure of a lower portion of the housing of an optical module according to an example of the present disclosure.

FIG. 5 is a schematic diagram illustrating a structure of the lower portion of the housing of the optical module of FIG. 2. As shown in FIG. 5, a bottom 406 and two sides 401, 402 of the lower portion of the housing define a U-shape, where the bottom 406 is formed as the bottom of the U-shape, and the two sides 401, 402 perpendicular to the bottom is formed as two sides of the U-shape. The sides 401, 402 are distributed in the width direction of the bottom 406 and may be parallel to each other. Unlike the upper portion of the housing, the sides 401, 402 of the lower portion of the housing may be perpendicular to the bottom 406 at the edge of the bottom 406 and therefore, the lower portion of the housing does not have a protruding section as the upper portion of the housing.

A distance between the two sides 301, 302 of the upper portion of the housing may be smaller than that between the two sides 401, 402 of the lower portion of the housing. In this way, when the upper portion of the housing is fitted onto the lower portion of the housing, the two sides 301, 302 of the upper portion of the housing may be inserted between the two sides 401, 402 of the lower portion of the housing to form a relatively closed cavity for enclosing electric components, where a gap may be formed between the sides 301, 302 of the upper portion of the housing and the sides 401, 402 of the lower portion of the housing.

The distance between the two sides 301, 302 of the upper portion of the housing may be smaller than that between the two sides 401, 402 of the lower portion of the housing, so that the two sides 301, 302 of the upper portion of the housing may be inserted between the two sides 401, 402 of the lower portion of the housing. When the two sides 301, 302 of the upper portion of the housing is inserted between the two sides 401, 402 of the lower portion of the housing, the sides 301, 302 of the upper portion of the housing are enclosed in the cavity and the sides 401, 402 of the lower portion of the housing are exposed outside the cavity. Since the sides 401, 402 of the lower portion of the housing have a particularly thickness, the two sides 301, 302 of the upper portion of the housing are not provided at the edge of the bottom 304 of the upper portion of the housing such that the bottom 304 of the upper portion of the housing is divided by the sides 301, 302 to have a protruding section 305 for covering the sides 401, 402 of the lower portion of the housing in the thickness direction.

Each of the two sides 401, 402 of the lower portion of the housing is provided with a second convex block 403 and a third convex block 404 that are adjacent to each other. The first convex block 303, the second convex block 403 and the third convex block 404 may all be located in a gap formed between the sides 301, 302 of the upper portion of the housing and the sides 401, 402 of the lower portion of the housing.

After the upper portion of the housing and the lower portion of the housing are assembled together, the first convex blocks 303 on the outer side of the sides 301, 302 of the upper portion of the housing may protrude toward the sides 401, 402 of the lower portion of the housing, and the second convex blocks 403 and the third convex blocks 404 on the inner side of the sides 401, 402 of the lower portion of the housing may protrude toward the first convex blocks 303 on the sides 301, 302 of the upper portion of the housing. A gap may be formed between the second convex block 403 and the third convex block 404, and the first convex block 303 may be inserted into the gap between the second convex block 403 and the third convex block 404.

Figure 8:
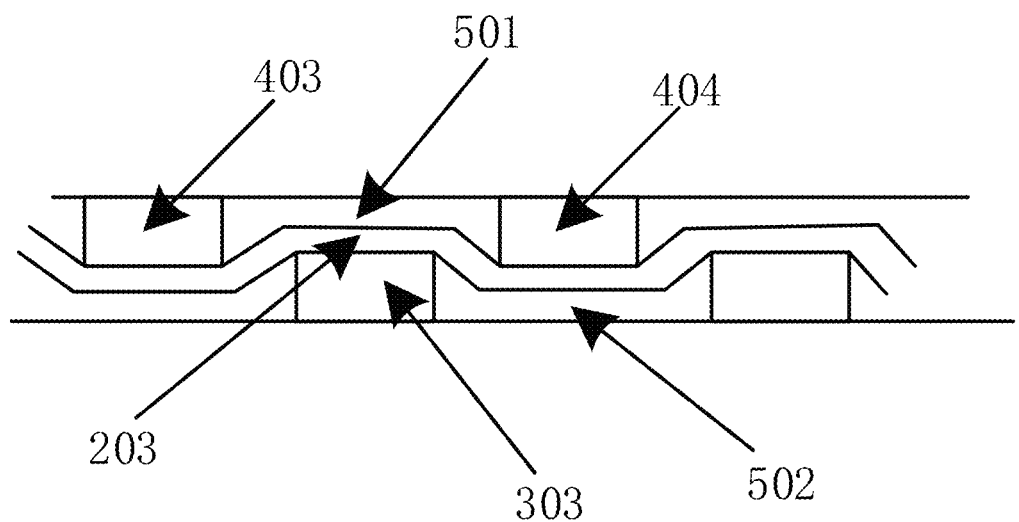
FIG. 8 is a schematic diagram illustrating gap division between an upper portion of the housing and a lower portion of the housing of an optical module according to an example of the present disclosure.

In an optical module provided according to an example of the present disclosure, the gap is formed by the sides 301, 302 of the upper portion of the housing and the sides 401, 402 of the lower portion of the housing and may be located inside the sides 401, 402 of the lower portion of the housing. The first convex block 303, the second convex block 403 and the third convex block 404 may all be located in the gap inside the sides 401, 402 of the lower portion of the housing. Further, the second convex block 403 and the third convex block 404 may be provided in a direction opposite to the first convex block 303. An electro-conductive sheet 203 may be clamped between the second convex block 403, the third convex block 404 and the first convex block 303. For example, the first convex block 303 may be inserted into the gap between the second convex block 403 and the third convex block 404 such that the electro-conductive sheet 203 may contact the surface of each convex block, as shown in FIG. 8. The convex blocks formed on the housing may be made of an electro-conductive material. Thus, the convex blocks 303, 403, 404 and the electro-conductive sheet 203 may divide the gap formed between the sides 301, 302 of the upper portion of the housing and the sides 401, 402 of the lower portion of the housing into a plurality of tiny gaps so as to block electromagnetic wave.

The convex blocks 303, 403, 404 may be configured as elastic vertical ribs distributed in a staggered manner on the sides 301, 302 of the upper portion of the housing and the sides 401, 402 of the lower portion of the housing. Since the electromagnetic wave shielding effect may be affected by the depth of the gap, the electromagnetic wave may be attenuated more greatly when the depth of the gap is greater. According to the above principle, the elastic vertical ribs 303, 403 and 404 in this example may be sloped to obtain a greater gap depth to some extent where all the elastic vertical ribs may have the same angle of slope. In addition, the elastic vertical ribs 303, 403 and 404 may be elastic elongated ribs made of phosphor bronze, beryllium bronze, manganese steel or stainless steel.

To smoothly insert the electro-conductive sheet 203 into the gap between the convex blocks 303, 403, 404, the first convex block 303 may not contact the sides 403, 404 of the lower portion of the housing, and the second convex block 403 and the third convex block 404 may not contact the sides 301, 302 of the upper portion of the housing, thereby facilitating subsequent assembly. For example, a size that the first convex block protrudes toward the sides 301, 302 of the lower portion of the housing may be smaller than the distance between the sides 301, 302 of the upper portion of the housing and the sides 401, 402 of the lower portion of the housing, and a size that each of the second convex block and the third convex block protrudes toward the side 301, 302 of the upper portion of the housing may be smaller than the distance between the sides 301, 302 of the upper portion of the housing and the sides 401, 402 of the lower portion of the housing. Thus, even though the gap between the side 301, 302 of the upper portion of the housing and the sides 401, 402 of the lower portion of the housing is large, the gap will be divided by the convex blocks 303, 403, 404 into a plurality of tiny gaps, thereby achieving effective electromagnetic isolation.

As shown in FIG. 5, the lower portion of the housing may also include a lower partition 405 perpendicular to all of the bottom 406 and the two sides 401, 402. The surface of the lower partition 405 may be provided with a fifth convex block and a sixth convex block.

The fourth convex block of the upper partition 306 may face the fifth convex block and the sixth convex block of the lower partition 405. For example, there may be a gap between the fifth convex block and the sixth convex block of the lower partition 405. The fourth convex block may be inserted into the gap such that an electro-conductive sheet may be clamped between the fourth convex block, the fifth convex block and the sixth convex block. The convex block structure formed between the upper partition 306 and the lower partition 405 may be similar to the convex block structure formed between the sides 301, 302 of the upper portion of the housing and the sides 401, 402 of the lower portion of the housing.

The sides 301, 302, 401, 402 of the housing may be perpendicular to the partitions 306, 405 of the housing so as to partition the internal cavity of the housing and form a cavity with an open end for accommodating electric components and an optical port region. An aperture for fiber to pass through may be formed in the partitions 306, 405. For example, the aperture may be formed in the upper partition 306 or in the lower partition 405, and may also be formed in both of the upper and lower partitions 306, 405.

Figure 6:
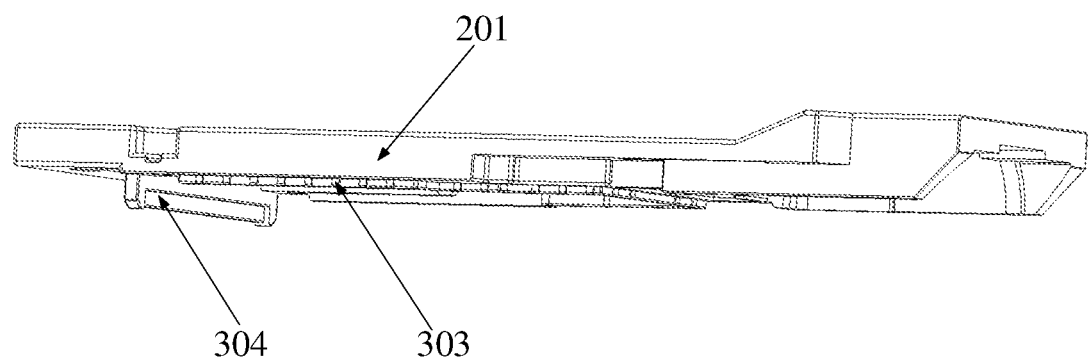
FIG. 6 is a schematic diagram illustrating a structure of an upper portion of the housing of an optical module according to another example of the present disclosure.

FIG. 6 is a schematic diagram illustrating a structure of an upper portion of the housing of an optical module according to another example of the present disclosure. As shown in FIG. 6, there may be a first convex block 303 on a side surface of the upper portion of the housing. The first convex block 303 may protrude outwardly from the optical module and may face the sides 401, 402 of the lower portion of the housing after the upper portion of the housing is assembled with the lower portion of the housing. For example, there may be a plurality of first convex blocks, and a gap may be formed between two adjacent first convex blocks 303.

As shown in FIG. 5, the sides 401, 402 of the lower portion of the housing may be provided with the second convex block 403 and the third convex block 404. The second convex block 403 and the third convex block 404 may protrude inwardly from the optical module and may face the sides 301, 302 of the upper portion of the housing after the upper portion of the housing is assembled with the lower portion of the housing, where a gap may be formed between the second convex block 403 and the third convex block 404.

Figure 7:
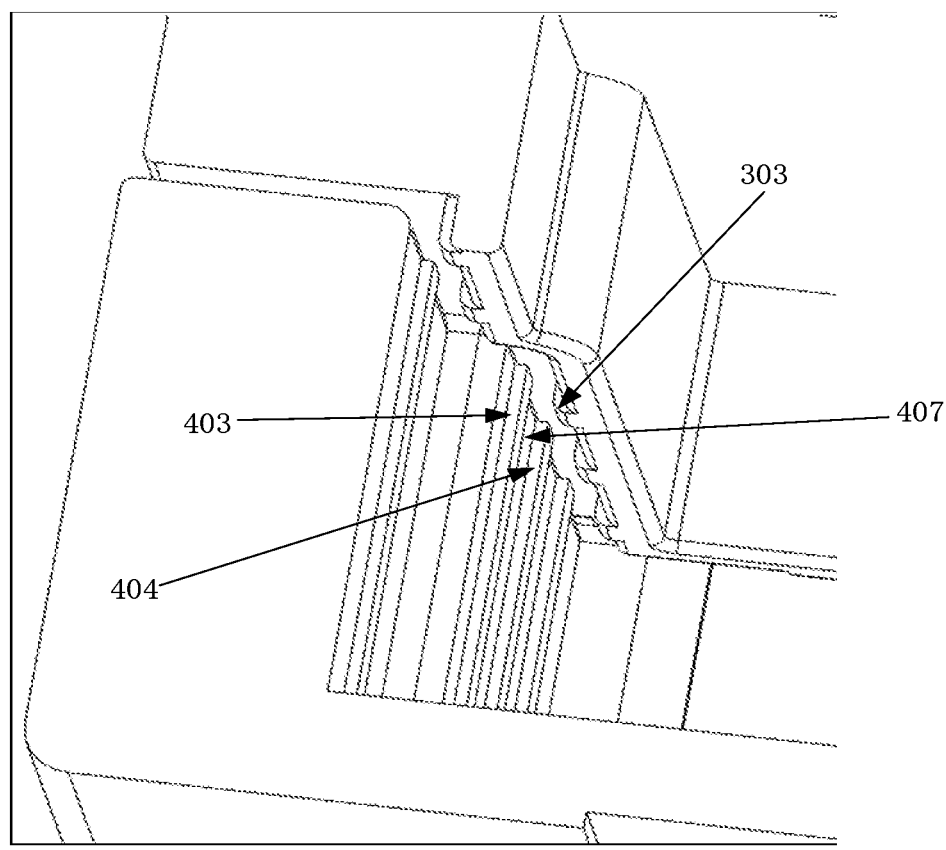
FIG. 7 is a partial enlarged diagram illustrating an assembly structure of an upper portion of the housing and a lower portion of the housing of an optical module according to an example of the present disclosure.

FIG. 7 is a partial enlarged diagram illustrating an assembly structure of an upper portion of the housing and a lower portion of the housing of an optical module according to an example of the present disclosure. As shown in FIG. 7, the sides of the upper portion of the housing are provided with the first convex block 303, and the sides of the lower portion of the housing are provided with the second convex block 403 and the third convex block 404. The first convex block 303 may be inserted into a gap 407 between the second convex block 403 and the third convex block 404. The first convex block 303, the second convex block 403 and the third convex block 404 may form a basic convex block structure in technical solution of the examples of the present disclosure. For example, the outer surface of the sides 301, 302 of the upper portion of the housing may be provided with a plurality of first convex blocks 303, and the inner surface of the sides 401, 402 of the lower portion of the housing may be provided with a plurality of second convex blocks 403 and a plurality of third convex blocks 404. The second convex block 403 is arranged adjacent to the third convex block. The second convex block 403 and the third convex block 404 adjacent to each other may form a convex block unit. There may be a plurality of convex block units 403, 404 on the lower portion of the housing. The side surfaces of the upper portion of the housing and the side surfaces of the lower portion of the housing may be continuously and repeatedly implemented with the basic convex block structures. In cooperation with the electro-conductive sheet 203, the gap between the side surfaces of the upper portion of the housing and the lower portion of the housing may be divided into a plurality of tiny gaps.

A gap may be formed between the second convex block 403 and the third convex block 404, and the first convex block 303 may be inserted into the gap to form a structure for clamping the electro-conductive sheet 203.

The electro-conductive sheet 203 may be a metal sheet. Since the metal sheet may be thick, a larger space may be needed for clamping the metal sheet. Therefore, the first convex block 303 may not contact the sides 401, 402 of the lower portion of the housing, and the second convex block 403 and the third convex block 404 may not contact the sides 301, 302 of the upper portion of the housing. The second convex block 403 and the third convex block 404 may not contact the first convex block 303.

Electro Magnetic Compatibility (EMC) means that a device or a system operates in an electromagnetic environment in compliance with requirements without producing unbearable electromagnetic interferences for any device in the environment. Therefore, the EMC may include two requirements: one is that the electromagnetic interference produced by a device in the environment where it is located should not exceed a particular limit; the other is that a device should have a particular immunity to interference present in the environment where it is located.

Shielding the electromagnetic wave may be achieved by stopping wave propagation based on the diffraction principle and the fluctuation characteristic of the electromagnetic wave. In an example of the present disclosure, with the structure of clamping an electro-conductive sheet by a first convex block, a second convex block and a third convex block, a gap between the upper and lower portion of the housings may be further divided into a plurality of tiny gaps. When the size of the tiny gap is close to the wavelength of the electromagnetic wave, the electromagnetic wave may be diffracted when passing through the tiny gap according to the diffraction principle of wave, leading to significant energy consumption and achieving the purpose of shielding the electromagnetic wave. A distance between every two adjacent convex blocks may be adjusted so as to form gaps of appropriate size, for example, the gaps of about one-twentieth of the wavelength of the electromagnetic wave to be shield, thereby shielding the electromagnetic wave.

For example, when the transmission rate of an optical module is 10 G Hz, the electromagnetic wavelength generated by electric components may be about 30 mm, and the distance between two adjacent first convex blocks 303 may be about 1.5 mm, the distance between the second convex block 403 and the third convex block 404 that are adjacent to each other may be about 1.5 mm, and the size of each of the convex blocks 303, 403, 404 may be about 0.5 mm.

For another example, when the transmission rate of the optical module is 25 G Hz, the electromagnetic wavelength generated by the electric components may be about 12 mm, and the distance between two adjacent first convex blocks 303 may be about 0.5 mm, the distance between the second convex block 403 and the third convex block 404 that are adjacent to each other may be about 0.5 mm, and the size of each of the convex blocks 303, 403, 404 may be about 0.5 mm.

The first convex block 303, the second convex block 403 and the third convex block 404 may clamp the electro-conductive sheet 203 to form a smallest gap division structure. In this way, the gap division structure may be repeated between two facing sides of the upper portion of the housing and the lower portion of the housing, so that the gap between two facing sides of the upper portion of the housing and the lower portion of the housing can be divided into a plurality of grids to prevent the electromagnetic wave passing through, where each grid is a tiny gap.

FIG. 8 is a division diagram illustrating a gap between an upper portion of the housing and a lower portion of the housing according to an example of the present disclosure. As shown in FIG. 8, a grid 501 is formed by clamping an electro-conductive sheet 203 by one convex block 303 on one side surface and two convex blocks 403, 404 on another side surface, and a grid 502 is formed by clamping the electro-conductive sheet 203 by two convex blocks 303 on one side surface and one convex block 404 or 403 on another side surface. Such a structure is repeatedly formed between two side surfaces so that a long and narrow gap between the two side surfaces of the upper portion of the housing and the lower portion of the housing can be divided into grids. Each grid can block the electromagnetic wave, thereby preventing the electromagnetic wave from passing through between the upper portion of the housing and the lower portion of the housing and achieving the purpose of electromagnetic shielding.

In a product implementation process, the electro-conductive sheet 203 may be formed as a structure with a plurality of bent. In an example of the present disclosure, the structure with a plurality of bent may be formed by squeezing the electro-conductive sheet 203 with the convex blocks 303, 403, 404 formed on the sides 301, 302 of the upper portion of the housing and the sides 401, 402 of the lower portion of the housing, thereby facilitating batch production.

Figure 9:
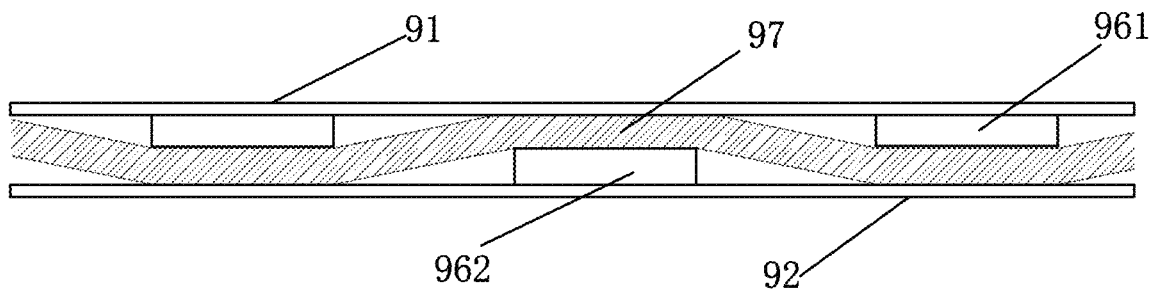
FIG. 9 is a schematic diagram illustrating gap division between an upper portion of the housing and a lower portion of the housing of an optical module according to another example of the present disclosure.

FIG. 9 is a schematic diagram illustrating a filling state of a gap between an upper portion of the housing and a lower portion of the housing of an optical module according to another example of the present disclosure. As can be seen in FIG. 9, a metal rib and an elastic electric conductor 97 may be included between a side 91 of an upper portion of the housing and a side 92 of a lower portion of the housing in the optical module, where the metal rib may include a first metal vertical rib 961 arranged on the outer surface of the side 91 of the upper portion of the housing and a second metal vertical rib 962 arranged on the inner surface of the side 92 of the lower portion of the housing. The first metal vertical rib 961 and the second metal vertical rib 962 may be distributed in a staggered manner along the length direction of the optical module. A size that each of the first metal vertical rib 961 and the second metal vertical rib 962 protrudes toward the corresponding housing is smaller than the distance between the side 91 of the upper portion of the housing and the side 92 of the lower portion of the housing so that the elastic electric conductor 97 can be filled with interference between the upper and lower portion of the housings. At least one end point of the first metal vertical rib 961 and a corresponding end point of the second metal vertical rib 962 may be located in the same horizontal line, and a distance between the first metal vertical rib 961 and the second metal vertical rib 962 that are adjacent to each other between the sides 91, 92 of the upper and lower portion of the housings may be smaller than 1/20 of the wavelength of the electromagnetic wave produced by a circuit board. In an example, the number of the elastic electric conductor is larger than one. In this case, a plurality of elastic electric conductors are disposed tightly between the first metal vertical rib 961 and a facing side of the lower portion of the housing and between the second metal vertical rib 962 and a facing side of the upper portion of the housing.

The major function of the metal ribs 961, 962 in this example is to achieve positioning effect for formation of a sub-gap. That is, the distribution of the metal ribs 961, 962 may directly affect the size of the sub-gap. The metal ribs 961, 962 may be in point-to-point contact or point-to-surface contact with the sides 91, 92. Therefore, the elastic electric conductor 97 may be provided between the metal ribs 961, 962 and the sides 91, 92. The elastic electric conductor 97 may be elastically deformed when being pressed so as to fill tightly between the first metal vertical rib 961 and the side 92 of the lower portion of the housing, and to fill tightly between the second metal vertical rib 962 and the side 91 of the upper portion of the housing. The metal ribs 961, 962 may cooperate with the elastic electric conductor 97 so that the gap formed between the sides 91, 92 of the two housings can be divided into a plurality of independent sub-gaps.

The metal ribs 961, 962 may be made of the same material as the upper portion of the housing and the lower portion of the housing. The first metal vertical rib 961 and the upper portion of the housing may be of an integrally-formed structure, and the second metal vertical rib 962 and the lower portion of the housing may also be of an integrally-formed structure.

In this example, the elastic electric conductor 97 may be a stainless steel sheet that may be inserted between the side 91 of the upper portion of the housing and the side 92 of the lower portion of the housing 92. The stainless steel sheet may be manufactured through a sheet metal process. The sheet metal process is a comprehensive cold machining process, and an ultra-thin metal sheet having a uniform thickness can be obtained by the sheet metal process. In addition, the stainless steel having relatively low content of chromium element may be used as the raw material for sheet metal machining in this example, and the stainless steel is relatively good in elasticity and may abut against the sides of the upper and lower portion of the housings after being significantly deformed so as to form surface-to-surface contact. Further, compared to other elastic electric conductors for filling gaps, such as an electro-conductive glue and sealing rubber, the stainless steel sheet is lower in cost, facilitating large-scale production of optical modules.

When an optical module is assembled, the stainless steel sheet may firstly be inserted into the cavity of the sides of the lower portion of the housing 92 and then the sides of the upper portion of the housing 91 may be embedded in the stainless steel sheet, and the three parts are distributed from outside to inside in the order of the sides of the lower portion of the housing 92, the stainless steel sheet and the sides of the upper portion of the housing 91. Since the first metal vertical rib 961 and the second metal vertical rib 962 are distributed in a staggered manner, when the sides of the upper portion of the housing 91 and the sides of the lower portion of the housing 92 are fitted together, the stainless steel sheet between the sides of the upper portion of the housing 91 and the lower portion of the housing 92 may be squeezed by the first metal vertical rib 961 and the second metal vertical rib 962 in two directions and then filled with interference between the first metal vertical rib 961 and the sides of the lower portion of the housing 92 and between the second metal vertical rib 962 and the sides of the upper portion of the housing 91 after being elastically deformed. Moreover, a portion of the stainless steel sheet may enter the sub-gaps between the first metal vertical rib 961 and the second metal vertical rib 962, reducing a horizontal length of the sub-gap to some extent and enhancing the electromagnetic shielding performance of the housing.

Figure 10:
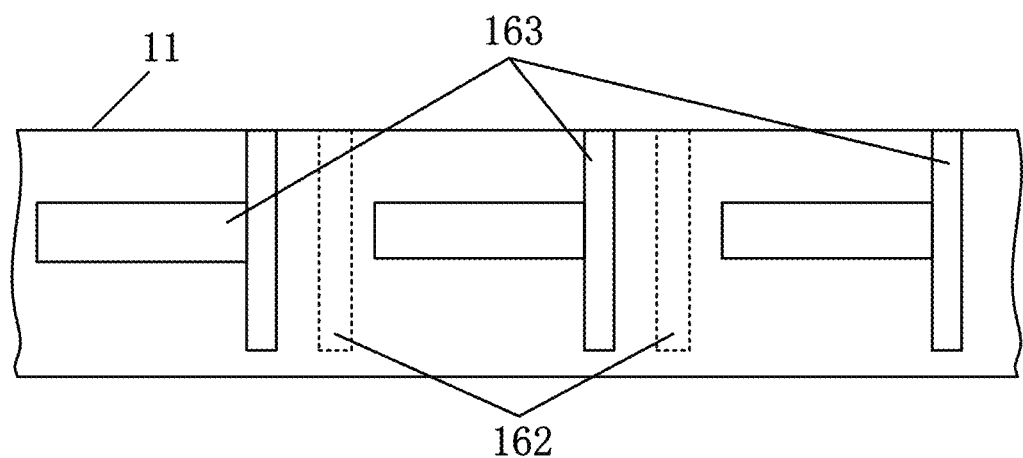
FIG. 10 is a schematic diagram illustrating gap division between an upper portion of the housing and a lower portion of the housing of an optical module according to yet another example of the present disclosure.

FIG. 10 is a schematic diagram illustrating a filling state of a gap between an upper portion of the housing and a lower portion of the housing of an optical module according to yet another example of the present disclosure. As can be seen in FIG. 10, a metal rib distributed on a side of an upper portion of the housing 11 is a T-shaped rib 163 in this example. The T-shaped rib 163 may be an integrated structure composed of a transverse rib section and a vertical rib section, where the width (i.e., the length in the vertical direction) of the transverse rib should not be too small and the horizontal length should not be too large so that 1 or 2 sub-gaps are just covered. If the horizontal length of the transverse rib is too large, the deformation of the elastic electric conductor 17 may be affected easily, forming a gap between the transverse rib and the sidewall of the upper portion of the housing 11 and resulting in electromagnetic leakage.

In addition, one or more second metal vertical rib 162 (indicated by dotted lines in FIG. 10) may be arranged on the lower portion of the housing in such a way that the second metal ribs 162 may be closer to the transverse rib section of the T-shaped rib 163. In this way, a sufficiently narrow sub-gap may be formed by the second metal vertical rib 162 and the transverse rib section of the T-shaped rib 163, thereby preventing the electromagnetic wave generated by main body of an optical module from passing through the sub-gap to some extent.

Figure 11:
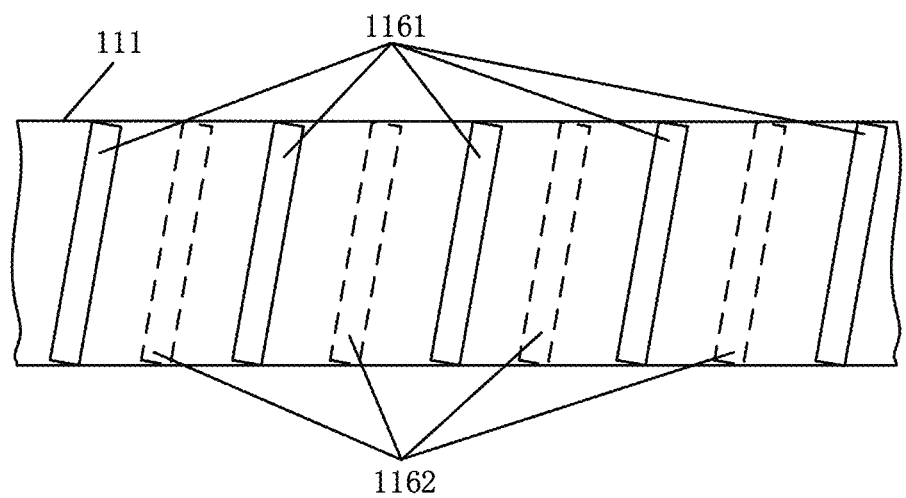
FIG. 11 is a schematic diagram illustrating gap division between an upper portion of the housing and a lower portion of the housing of an optical module according to still another example of the present disclosure.

FIG. 11 is a diagram illustrating a distribution of metal vertical ribs according to still another example of the present disclosure. As can be seen in FIG. 11, in this example, a first metal vertical rib 1161 and a second metal vertical rib 1162 may be sloped in the length direction of the optical module at the same angle of slope. To control such factors as the size of the sub-gap and assembly, the angle of slope of the metal ribs 1161, 1162 should not be too large. To further increase the depth of the sub-gap, a side of an upper portion of the housing 111 and a sidewall of a lower portion of the housing (not shown in FIG. 11) may have the same height, and a vertical distance between two endpoints of each of the first metal vertical rib 1161 and the second metal vertical rib 1162 may be equal to the height of the upper portion of the housing 111 or the lower portion of the housing.

In this example, a sub-gap depth (i.e., the length of the sub-gap in a vertical direction) may be increased by positioning the metal ribs 1161, 1162 at an angle of slope or by enabling the metal ribs 1161, 1162 and the upper portion of the housing 111 and the lower portion of the housing 112 to have the same height. In other examples, the sub-gap depth may be increased by one of the above methods or by other methods.

Finally, it should be noted that the above examples are merely intended to illustrate the technical solutions of the present disclosure rather than to limit the present disclosure. Although the present disclosure is described in detail with reference to the aforesaid examples, those of ordinary skill in the art should understand that modifications can still be made to the technical solutions contained in the different examples as described above or equivalent substitutions can still be made to some technical features therein. These modifications or substitutions will not cause the nature of the corresponding technical solutions to depart from the spirit and scope of the technical solutions of the different examples of the present disclosure.

What is claimed is:

1. An optical module, comprising:
  a housing comprising a lower portion and an upper portion;
  the upper portion of the housing comprising a bottom and two sides defining a U-shape;
  the lower portion of the housing comprising a bottom and two sides defining a U-shape, the two sides of the upper portion being inserted between the two sides of the lower portion to form a cavity, wherein:
    at least one first convex block is disposed on an outer surface of each of the two sides of the upper portion of the housing, and is configured to face one of the two sides of the lower portion of the housing, at least one second convex block and at least one third convex block are disposed on an inner surface of each of the two sides of the lower portion of the housing, and are configured to face one of the two sides of the upper portion of the housing, and the at least one first convex block is inserted into a gap between the at least one second convex block and the at least one third convex block;

an electro-conductive sheet disposed between the at least one first convex block, the at least one second convex block and the at least one third convex block; and at least one electric component disposed inside the cavity.

2. The optical module of claim 1, wherein:
the upper portion of the housing, the lower portion of the housing, the first convex block, the second convex block and the third convex block comprise electrical conductive material.

3. An optical module, comprising:
a housing comprising a lower portion and an upper portion;
the upper portion of the housing comprising a bottom and two sides defining a U-shape;
the lower portion of the housing comprising a bottom and two sides defining a U-shape, the two sides of the upper portion being inserted between the two sides of the lower portion to form a cavity, wherein:
  at least one first convex block is disposed on an outer surface of each of the two sides of the upper portion of the housing, and is configured to face one of the two sides of the lower portion of the housing,
  at least one second convex block and at least one third convex block are disposed on an inner surface of each of the two sides of the lower portion of the housing, and are configured to face one of the two sides of the upper portion of the housing, and
  the at least one first convex block is inserted into a gap between the at least one second convex block and the at least one third convex block;
an electro-conductive sheet disposed between the at least one first convex block, the at least one second convex block and the at least one third convex block;
at least one electric component disposed inside the cavity; and
wherein:
  a number of the at least one first convex block is larger than one,
  a distance between two adjacent first convex blocks is smaller than one twentieth of a wavelength of electromagnetic waves generated by the at least one electric component, and
  a distance between two adjacent second and third convex blocks is smaller than one twentieth of the wavelength of the electromagnetic waves generated by the at least one electric component.

4. The optical module of claim 3, wherein:
a size that the at least one first convex block protrudes toward the faced side of the two sides of the lower portion of the housing is smaller than a distance between a side of the two sides of the upper portion of the housing on which the at least one first convex block is disposed and the faced side of the two sides of the lower portion of the housing; and
a size that each of the at least one second convex block and the at least one third convex block protrudes toward the faced side of the two sides of the upper portion of the housing is smaller than a distance between a side of the two sides of the lower portion of the housing on which the at least one second convex block and the at least one third convex block are disposed and the faced side of the two sides of the upper portion of the housing.

5. The optical module of claim 1, wherein:
the at least one first convex block, the at least one second convex block and the at least one third convex block comprise elastic vertical ribs.

6. The optical module of claim 5, wherein
the elastic vertical ribs are sloped; and
an angle of slope of the elastic vertical ribs are same.

7. The optical module of claim 1, wherein:
the upper portion of the housing further comprises an upper partition perpendicular to the two sides of the upper portion of the housing and the bottom of the upper portion of the housing;
the lower portion of the housing further comprises a lower partition perpendicular to the two sides of the lower portion of the housing and the bottom of the lower portion of the housing;
at least one fourth convex block is disposed on the upper partition, and configured to face the lower partition;
at least one fifth convex block and at least one sixth convex block are disposed on the lower partition, and configured to face the upper partition;
the at least one fourth convex block is inserted in a gap between the at least one fifth convex block and the at least one sixth convex block; and
the at least one fourth convex block, the at least one fifth convex block and the at least one sixth convex block clamp the electro-conductive sheet.

8. The optical module of claim 7, wherein:
a number of the at least one fourth convex block is larger than one;
a distance between two adjacent fourth convex blocks is smaller than one twentieth of a wavelength of electromagnetic waves generated by the at least one electric component; and
a distance between two adjacent fifth and sixth convex blocks is smaller than one twentieth of the wavelength of the electromagnetic waves generated by the at least one electric component.

9. The optical module of claim 7, wherein:
the fourth convex block, the fifth convex block and the sixth convex block comprise elastic vertical ribs.

10. The optical module of claim 1, wherein
the bottom of the upper portion of the housing has a protruding section relative to each of the two sides of the upper portion of the housing; and
the protruding section is configured to cover the two sides of the lower portion of the housing in a thickness direction.

11. An optical module, comprising:
a housing comprising a lower portion and an upper portion;
the upper portion of the housing comprising a bottom and two sides defining a U-shape, wherein a first metal vertical rib is disposed on an outer surface of the two sides of the upper portion of the housing;
the lower portion of the housing comprising a bottom and two sides defining a U-shape, wherein:
  a second metal vertical rib is disposed on an inner surface of the two sides of the lower portion of the housing, the two sides of the upper portion of the housing are inserted between the two sides of the lower portion of the housing to form a cavity, the first metal vertical rib and the second metal vertical rib are distributed in a staggered manner, and a size that the first metal vertical rib and the second metal vertical rib protrude toward the corresponding housing is smaller than a distance between two facing sides of the upper portion of the housing and the lower portion of the housing;

an elastic electric conductor disposed tightly between the first metal vertical rib and a facing side of the lower portion of the housing and between the second metal vertical rib and a facing side of the upper portion of the housing; and a circuit board disposed inside the cavity.

12. The optical module of claim 11, wherein:
a distance between the first metal vertical rib and the second metal vertical rib which are adjacent to each other is smaller than one twentieth of a wavelength of electromagnetic waves generated by the circuit board.

13. The optical module of claim 11, wherein:
the first metal vertical rib and the second metal vertical rib are sloped at a same angle of slope.

14. The optical module of claim 11, wherein the first metal vertical rib and the upper portion of the housing are of an integrated structure.

15. The optical module of claim 11, wherein the second metal vertical rib and the lower portion of the housing are of an integrated structure.

16. The optical module of claim 11, wherein:
the first metal vertical rib is of a T-shaped structure comprising a transverse rib section and a vertical rib section; and
the second metal vertical rib is close to the transverse rib section of the first metal vertical rib.

17. The optical module of claim 11, wherein the first metal vertical rib and the second metal vertical rib have a same length.

18. The optical module of claim 11, wherein the upper portion of the housing and the lower portion of the housing comprise electrical conductive material.

19. The optical module of claim 11, wherein the upper portion of the housing and the lower portion of the housing are made of at least one of a tin alloy, a nickel alloy or a tin-nickel alloy.

* * * * *